United States Patent
Bost et al.

[19]

[11] Patent Number: 5,986,315
[45] Date of Patent: Nov. 16, 1999

[54] GUARD WALL TO REDUCE DELAMINATION EFFECTS WITHIN A SEMICONDUCTOR DIE

[75] Inventors: Melton C. Bost, Beaverton; Robert A. Gasser, Tigard; Shi-Ning Yang, Portland; Timothy L. Deeter, Beavberton, all of Oreg.

[73] Assignee: Intel Corporation, Santa Clara, Calif.

[21] Appl. No.: 08/112,445

[22] Filed: Aug. 26, 1993

Related U.S. Application Data

[62] Division of application No. 07/799,556, Nov. 27, 1991, Pat. No. 5,270,256.

[51] Int. Cl.$^6$ .................................................. H01L 21/31
[52] U.S. Cl. .................... 257/409; 257/484; 257/605; 257/629; 257/630
[58] Field of Search .................... 257/409, 484, 257/605, 629, 630

[56] References Cited

U.S. PATENT DOCUMENTS

| | | |
|---|---|---|
| 4,096,622 | 6/1978 | MacIver . |
| 4,137,109 | 1/1979 | Aiken et al. . |
| 4,261,095 | 4/1981 | Dreves et al. . |
| 4,317,274 | 3/1982 | Yasunari ................................. 257/409 |
| 4,375,597 | 3/1983 | Kosonocky ............................. 257/476 |
| 4,414,737 | 11/1983 | Menjo et al. . |
| 4,507,853 | 4/1985 | McDavid . |
| 4,549,914 | 10/1985 | Oh . |
| 4,641,420 | 2/1987 | Lee ........................................... 257/774 |
| 4,656,732 | 4/1987 | Teng et al. . |
| 4,691,435 | 9/1987 | Anantha et al. . |
| 4,722,910 | 2/1988 | Yasaitis . |

FOREIGN PATENT DOCUMENTS

| | | | |
|---|---|---|---|
| 58-202550 | 11/1983 | Japan . | |
| 63-211755 | 9/1988 | Japan . | |
| 64-69051 | 3/1989 | Japan ..................................... 457/484 |
| 2240427 | 7/1991 | United Kingdom ................... 257/630 |

OTHER PUBLICATIONS

Full English Translation of Japan Kokai 64–69051 as per Uspto.

*Primary Examiner*—J. Carroll
*Attorney, Agent, or Firm*—Blakely, Sokoloff, Taylor & Zafman LLP

[57] ABSTRACT

A method of forming a guard wall for a semiconductor die is described. A dielectric layer is deposited over a semiconductor substrate. The dielectric layer is patterned to form a guard wall opening extending through the dielectric layer. The guard wall opening lies adjacent to an electrically active region of the die. The guard wall opening has a pattern without any straight line segments greater than about 10 $\mu$m long. A first layer is deposited over the substrate and etched to form a first layer sidewall spacer along a side of the guard wall opening. A second layer is deposited within the guard wall opening to form the guard wall.

24 Claims, 9 Drawing Sheets

GUARD WALL TO REDUCE DELAMINATION EFFECTS WITHIN A SEMICONDUCTOR DIE

This is a divisional of application Ser. No. 07/799,556, filed Nov. 27, 1991, U.S. Pat. No. 5,270,256.

FIELD OF THE INVENTION

The present invention relates to the field of semiconductor devices, and in particular, to substantially preventing the propagation of delamination when such propagation is capable of moving towards an electrically active region of the die whether or not the delamination starts from the edge of the die.

BACKGROUND OF THE INVENTION

Many state of the art devices require relatively planar surfaces in order to get optimum device performance. A dielectric layer may be deposited on a substrate as an insulating layer within a semiconductor die, such as between an electrically active region of the die and an electrical interconnect layer. The electrically active region may include a semiconductor transistor, a polysilicon load resistor, electrical interconnect lines, and bond pads. The dielectric layer may have a substantially nonplanar surface as deposited. The dielectric layer may be reflowed to make its surface more planar. Chemically deposited, undoped silicon dioxide needs a temperature of at least 1000° C. to reflow. At 1000° C., the diffusion junctions diffuse significantly further and cannot be utilized for state of the art devices requiring shallow diffusion junctions and minimal lateral diffusion.

The reflow temperature is typically dependent upon the dopant concentration within the dielectric layer. As the dopant concentration in the dielectric layer increases, the temperature at which the layer reflows decreases. Therefore, a doped dielectric layer reflows at a substantially lower temperature compared to its undoped version. Boron and phosphorus are common dopants added when depositing a silicon dioxide layer to form a borophosphosilicate glass (BPSG) layer. When the BPSG layer includes about 6.4 weight % boron and about 3.8 weight % phosphorus, the BPSG layer reflows in steam at a temperature of about 825° C.

A BPSG layer having about 6.4 weight % boron and about 3.8 weight % phosphorus may delaminate during subsequent operations. When a die having the BPSG layer is assembled into a plastic package and subjected to pressure pot testing (steam at a pressure greater than atmospheric pressure), the BPSG layer may delaminate. A theory is that the steam dissolves or weakens the bonds within the BPSG layer causing the BPSG layer to delaminate. The delamination typically starts at the edge of the die and propagates towards the center of the die. If the delamination reaches an electrical interconnect, the forces within the die that cause the delamination are then applied to the electrical interconnect causing the electrical interconnect to rip apart at the weakest point in a vertical interconnect stack, typically near a contact opening, or at an interface within the electrical interconnect, such as an aluminum-silicide interface, for example. The delamination may cause other reliability problems, for instance, allowing moisture within a die's hermetic protection.

The BPSG delamination generally does not occur at lower dopant concentrations, but the BPSG layer does not significantly reflow at about 825° C. in steam when the total dopant concentration is less that about 5 mole %. If a higher reflow temperature is used, the diffusion junctions or other parts of the die may be adversely affected by the high temperature.

Figure 1:
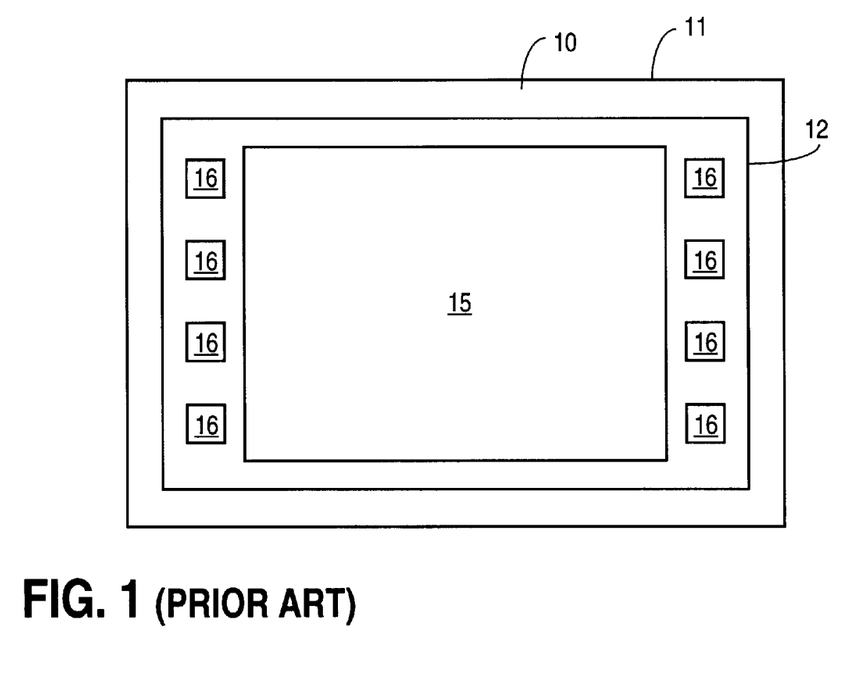
FIG. 1 includes a top view of a die having a prior art guard ring.

Guard rings that are used to stop the diffusion of contaminants into an electrically active region of a die are well known in the prior art. An electrically active region may include a transistor, buried bit lines, word lines, etc. A typical prior art guard ring is formed by etching an opening through a BPSG layer and filling the opening with a metallic compound, such as aluminum, for example, to stop the contaminants. FIG. 1 shows a typical prior art guard ring. FIG. 1 includes a die 10 that has an edge 11. A guard ring 12 is near the edge 11. The guard ring is substantially parallel to the edge of the die, and each of the four sides of the guard ring generally forms four straight line segments. Within the guard ring 12 are an electrically active region 15 and bond pads 16.

Figure 2:
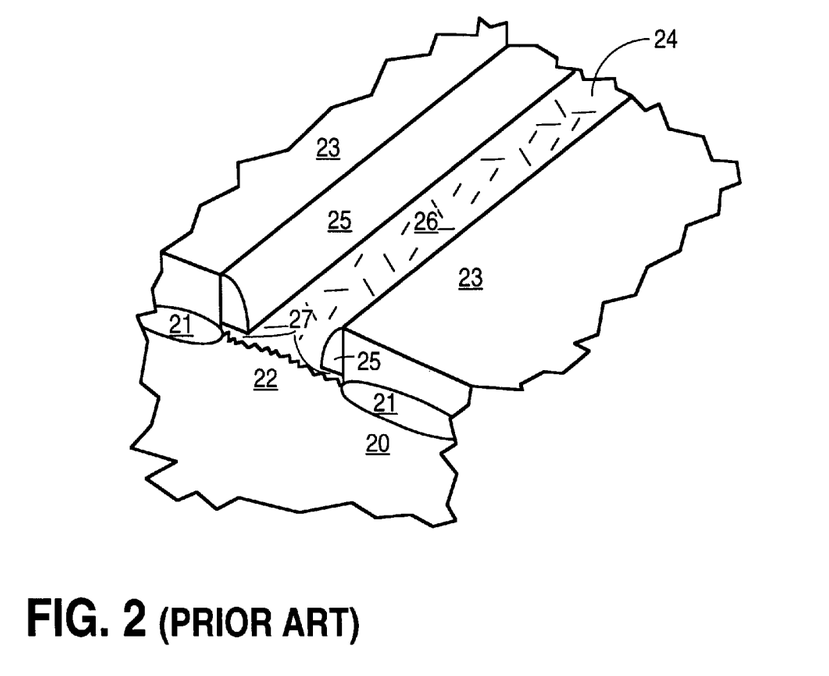
FIG. 2 shows a perspective view of long sidewall spacers after being undercut. (Prior art)

Some state of art technologies requires contact openings or vias to be filled prior to depositing an interconnect layer. Problems may arise when forming the prior art guard ring that are described in reference to FIG. 2. A semiconductor substrate includes a monocrystalline silicon layer (silicon layer) 20 having a channel region 22. Over the silicon layer 20 are field oxide areas 21 that lie adjacent to the channel region 22. A patterned BPSG layer 23 includes a guard ring opening 24. During a contact or via fill process, a layer of a conductive material, such as tungsten, for example, is deposited over the substrate and etched back, thereby forming sidewall spacers 25 along the sides of the guard ring opening 24. The sidewall spacers 25 are typically very long (at least 100 μm long) and may have enough force to peel away from the sides of the guard ring opening 24. A silicide layer is typically formed before the tungsten is deposited. Therefore, the spacers lie on the silicide layer. The silicide layer is removed to form a rough surface 26 during the spacer etch or a clean before depositing an electrical interconnect layer. The sidewall spacers 25 are undercut thereby forming a gap 27 between the channel region 22 and the sidewall spacers 25. Because of no mechanical support under the sidewall spacers 25, there is an increased likelihood that the sidewall spacers 25 peel from the sides of the guard ring opening 24.

Therefore, the prior art guard ring stops the BPSG layer delamination, but the guard ring formation process may cause other problems when a contact or via fill process is used. The guard ring typically has straight, long uninterrupted sides as shown in FIG. 1. Sidewall spacers may be formed along the sides of the guard ring opening when a contact hole or via filling process is used. The spacers may have enough force to peel away from the sides of the guard ring opening. If the spacers are formed over a silicide layer, the spacers may be undercut thereby increasing the probability that the spacers peel from the sides of the guard ring opening. If the spacers peel from the sides of the guard ring opening, particles, unwanted electrical shorts or reliability problems may occur.

SUMMARY AND OBJECTS OF THE INVENTION

In view of the foregoing, one object of the present invention is to form a semiconductor die including a dielectric layer that does not delaminate near an electrically active region of the die.

Another object of the present invention is to form a planarized dielectric layer without adversely affecting diffusion junctions or causing dielectric layer delamination within a semiconductor die.

It is still another object of the present invention to form a guard ring that prevents a dielectric layer from delaminating without generating particles, unwanted shorts, or reliability problems with a semiconductor die.

A method of forming a semiconductor die including a guard wall to stop dielectric layer delamination and contaminants from reaching an electrically active region of the die is described. A guard wall is formed having a pattern without any straight line segments that are more than 10 μm long. The shorter line segments do not allow sufficient stress to build up within sidewall spacers that form along a guard wall opening. Therefore, the spacers are less likely to peel away from the sides of the guard wall. A guard ring that substantially stops delamination and contamination from reaching an electrically active region of the die without complications due to peeling sidewall spacers is also described. Numerous alternate embodiments exist for the present invention.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

The present invention forms a guard wall near an electrical component of a semiconductor die to produce a die that is less susceptible to delamination of a dielectric layer or contamination reaching an electrically active region that may include a transistor, a buried bit line, a word line, etc. Briefly referring to FIG. 19, the currently preferred embodiment is illustrated. The die 40 has a stitched guard ring 190 that substantially prevents BPSG layer delamination or contamination that starts near the die's edges 41 from reaching the electrically active region 45 and the bond pads 200. When sidewall spacers are formed within the guard ring opening, the spacers are less likely to peel from the sides of the guard ring opening. In the currently preferred embodiment, the guard ring opening has straight line segments that are no longer than about 3.0 μm. In alternate embodiments, the guard wall opening does not have a straight line segment, or if it does, the straight line segments are no longer than about 10.0 μm. In addition, the spacers are not formed over a silicide layer that is subsequently etched away.

The present invention may be used where dielectric layer delamination occurs in localized areas. In these localized areas, a guard wall may be used instead of a guard ring. Although the present invention is described in conjunction with a metal-oxide-semiconductor device, the present invention may also be used with bipolar and III–V semiconductor devices. Many different types of materials may be used with the present invention. A dielectric layer comprises silicon dioxide, silicon nitride, or silicon oxynitride. The sidewall spacers are typically conductive and comprise a material such as a metal, a metallic compound, or doped polycrystalline silicon (polysilicon). The guard ring filling material is typically an interconnect material, but it may be filled with other types of materials. The guard ring fling material typically comprises a metal, a metallic compound, polysilicon, or a dielectric layer. The present invention includes numerous patterns disclosed below, but the present invention is not limited by those patterns. The present invention is described with many alternative embodiments but one skilled in the art will appreciate that the invention is not limited by the embodiments listed herein.

Figure 3:
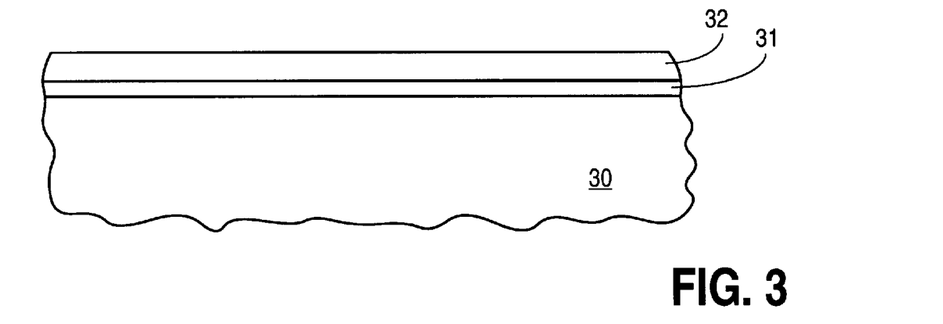
FIG. 3 depicts a cross sectional view of a portion of a semiconductor substrate after a silicon nitride layer is deposited over the substrate.

In the currently preferred embodiment of the present invention, a die is formed on a semiconductor substrate. References are occasionally made to the die's electrically active region because the currently preferred embodiment is used with process steps of an existing process sequence used to form the die. Therefore, additional process steps are not added. FIG. 3 includes an illustration of a cross-sectional view of a portion the substrate. The substrate includes a monocrystalline silicon layer (silicon layer) 30, a pad oxide layer 31, which comprises silicon dioxide, and a silicon nitride layer 32.

Figure 4:
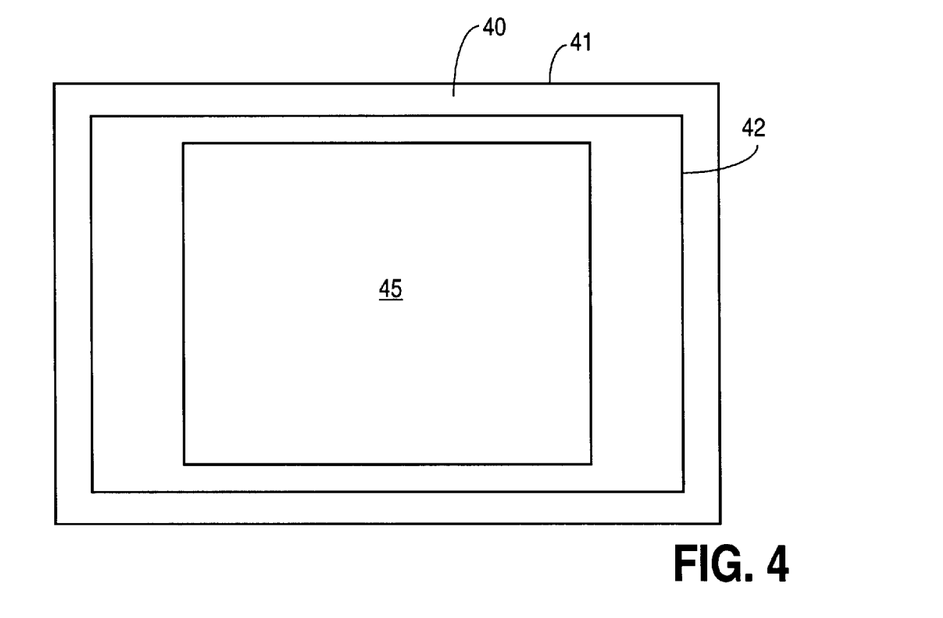
FIG. 4 illustrates a top view of a die during field isolation patterning.
Figure 5:
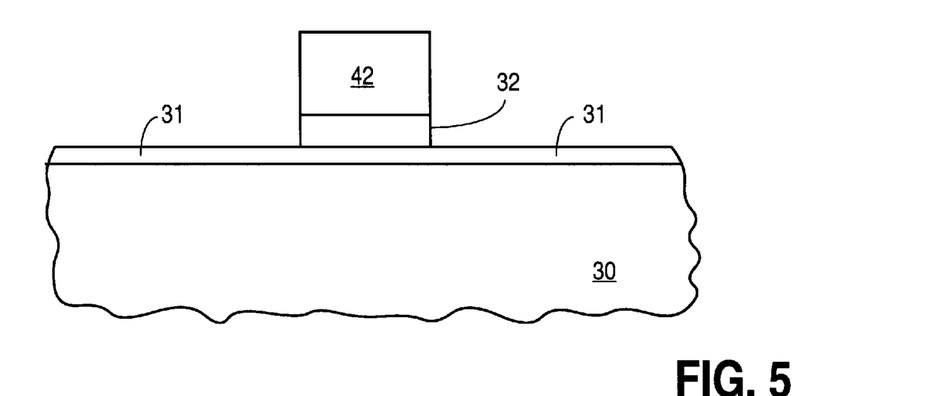
FIG. 5 shows a cross sectional view of the substrate of FIG. 3 after the silicon nitride layer has been selectively etched.

The substrate is coated with a first photoresist layer and patterned thereby forming a photoresist members over the silicon nitride layer 32. FIG. 4 includes a top view of a die 40 having an edge 41. The photoresist pattern includes a photoresist member 42 about 2.0 μm wide. The photoresist member 42 lies near the edge of the die. An electrically active region 45 includes photoresist members (not shown). For simplicity, the electrically active region 45 is illustrated without its patterning details. The silicon nitride layer 32 is selectively etched from the substrate as shown in FIG. 5. The photoresist member is removed by plasma ashing or a hot mixture of sulfuric acid and hydrogen peroxide.

Figure 6:
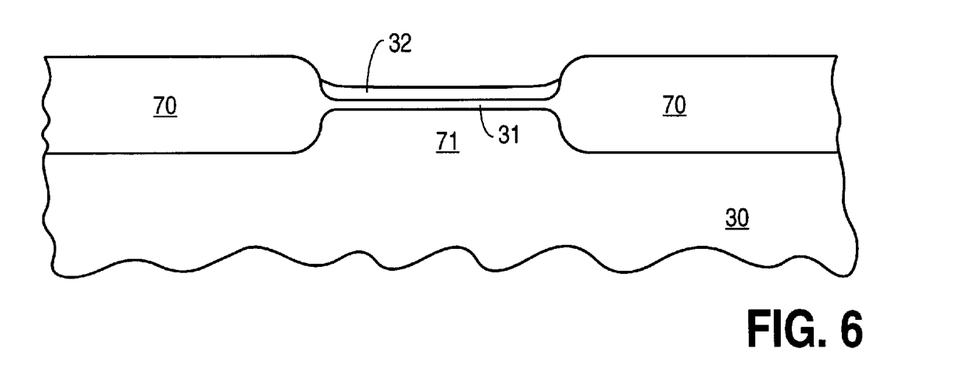
FIG. 6 illustrates the substrate of FIG. 5 after field oxide areas are formed.

Referring to FIG. 6, the substrate is subjected to a long steam oxidation that grows field oxide areas 70 about 6000 Å thick from the silicon layer 30 where the silicon nitride layer 32 is not present over the substrate. Between the field oxide areas 70 is a channel region 71 of the silicon layer 30. Field oxide areas and channel regions similar to those shown in FIG. 6 are formed within the electrically active region 45. Although the channel region 71 is similar to the channel regions within the electrically active region, the channel region 71 is not used to make an electrically active device, such as a transistor, for example.

Figure 7:
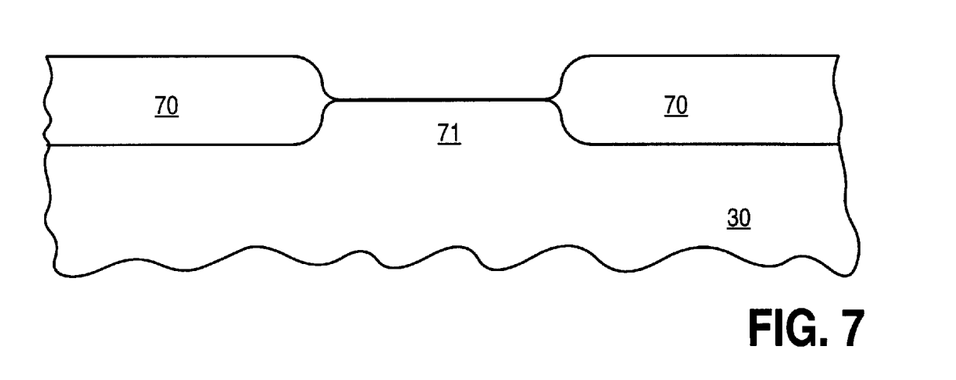
FIG. 7 shows the substrate of FIG. 6 after a pad oxide layer is removed.
Figure 8:
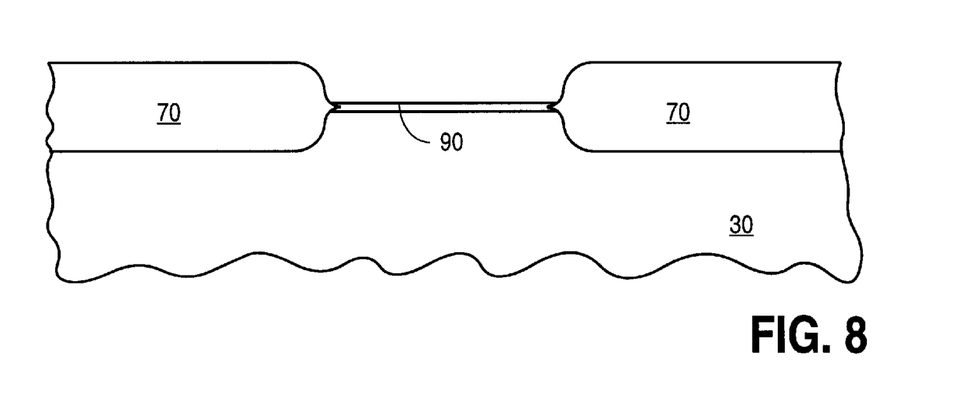
FIG. 8 depicts the substrate of FIG. 7 after a titanium silicide layer is formed.

The silicon nitride layer 32 and the pad oxide layer 31 are removed to expose the silicon layer 30 within the channel region 71 as shown in FIG. 7. The substrate is deposited with a titanium layer, and the substrate is then subjected to a silicidation step using well known methods. The silicidation step forms a titanium silicide layer where the titanium layer is in contact with a silicon layer. Titanium does not react to form titanium silicide where the titanium is in contact with the field oxide areas 70. The unreacted titanium is removed using well known methods. FIG. 8 includes an illustration of the titanium silicide layer 90 within the channel region 71. Other silicide materials formed using cobalt, molybdenum, tungsten, or tantalum may be formed over the channel region 71 instead of the titanium silicide. In a metal-oxide-semiconductor device, other steps (not show) are typically used to form a gate oxide layer, a gate electrode, and source and drain regions. These other steps are typically performed between or after the previously described steps. The other steps are done before a glass layer is deposited.

Figure 9:
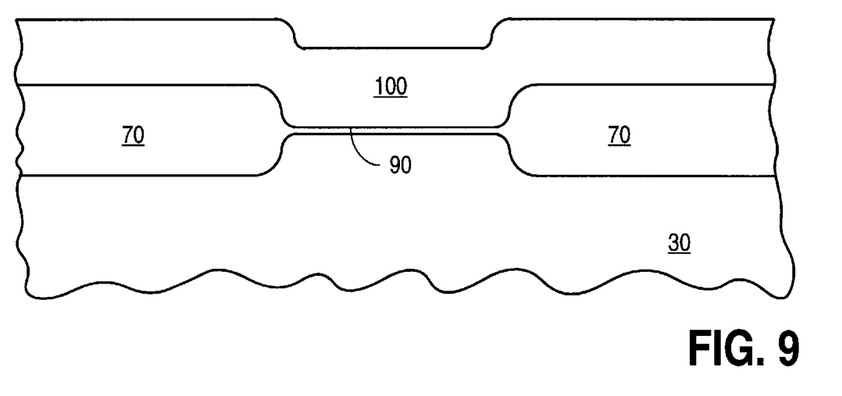
FIG. 9 illustrates the substrate of FIG. 8 after a BPSG layer is deposited.
Figure 10:
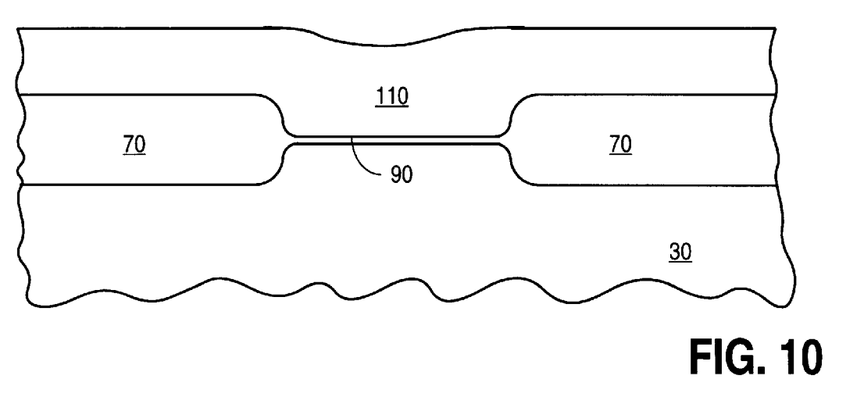
FIG. 10 depicts the substrate of FIG. 9 after the BPSG layer is reflowed.

A borophosphosilicate glass (BPSG) layer 100 about 8000 Å thick is chemically deposited over the substrate as shown in FIG. 9. The BPSG layer 100 comprises silicon dioxide doped with about 6.4 weight % boron and about 3.8 weight % phosphorus. The substrate is placed into a furnace at about atmospheric pressure. The furnace ambient comprises steam at about 825° C. The substrate with the BPSG layer is reflowed for between about 30 minutes and about 60 minutes. FIG. 10 includes an illustration of a reflowed BPSG layer 110 having less abrupt topography changes compared to the deposited BPSG layer 100.

Figure 11:
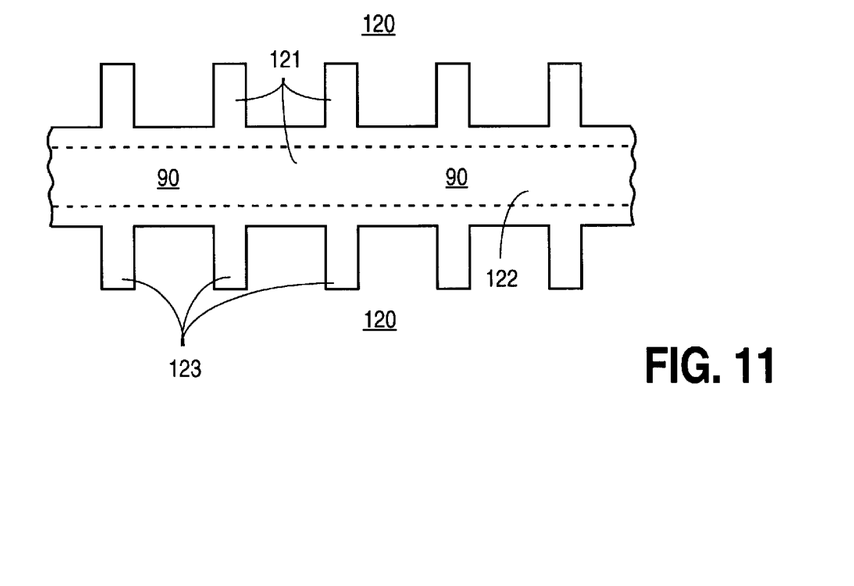
FIG. 11 shows a top view of a patterned photoresist layer having an opening over the titanium silicide region.
Figure 12:
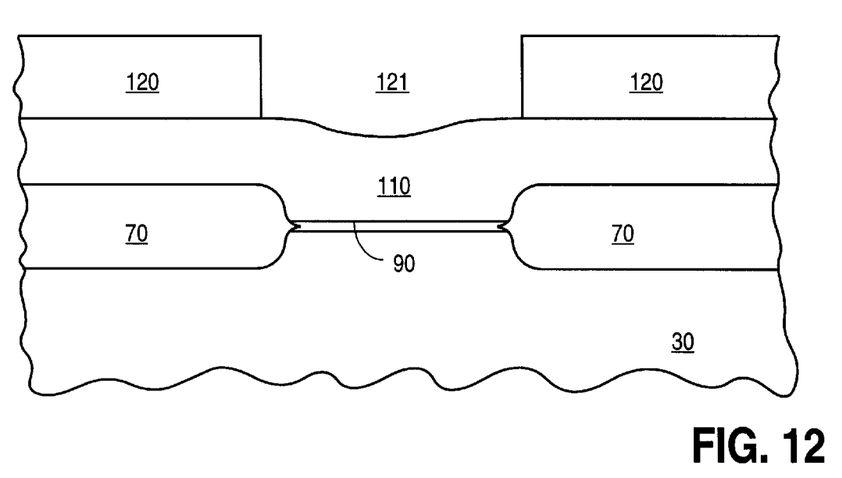
FIG. 12 illustrates the substrate of FIG. 10 after a patterned photoresist layer is formed over the BPSG layer.

The substrate is coated with a second photoresist layer and patterned thereby forming photoresist members over the BPSG layer 110. FIG. 11 includes a top view of a portion of the photoresist pattern with respect to the titanium silicide layer 90 that lies over the channel region 71. The photoresist pattern includes photoresist members 120 and a photoresist opening 121. The opening 121 has a main line 122 and cross members 123. The main line 122 is about 3.0 μm wide. The cross members 123 are substantially perpendicular to the main line 122. Each cross member 123 is about 1.0 μm wide and extend about 2.0 μm away from the main line 122. The distance between the centers of a pair of cross members 123 is about 5.0 μm. The opening 122 has a minimum width that is about equivalent to the width of the titanium silicide layer 90 and the width of the bases of subsequently formed sidewall spacers. When sidewall spacers are subsequently formed, the spacers do not lie above the titanium silicide layer 90. FIG. 12 is a cross sectional view of a portion of the substrate in FIG. 10 after the second photoresist layer is coated and patterned. FIG. 12 includes photoresist members 120 and a photoresist opening 121.

Figure 13:
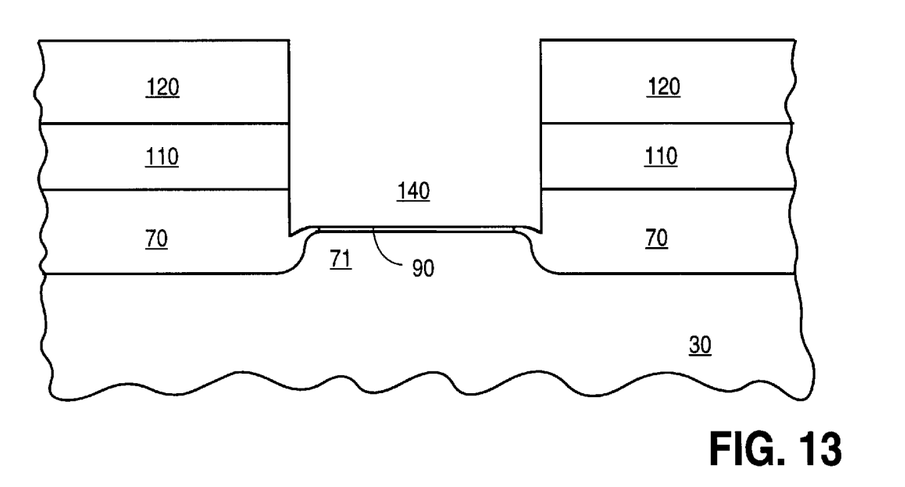
FIG. 13 depicts the substrate of FIG. 12 after the BPSG layer is etched.

The substrate is etched using well known methods to form a guard ring opening 140 as shown in FIG. 13. All of the BPSG layer 110 within the second photoresist layer opening and part of the field oxide areas 70 are removed to expose the titanium silicide layer 90 that lies over the channel region 71. Contact openings (not shown) are made through the BPSG layer 110 within the electrically active region at the same time the guard ring opening 140 is formed. The etch time for the step is kept as short as possible to minimize etch damage within the contact openings. This is why the guard ring opening is formed over a channel region 71. If the guard ring is formed over a field oxide area and the etch is continued until the silicon layer 30 is reached, the guard ring opening 140 would take significantly longer to etch than the contact openings. The contact openings may sustain excessive etch damage thereby giving unacceptably high contact resistance. Therefore, the currently preferred embodiment forms the guard ring opening 140 over the channel region 71, so that the time to etch the guard wall opening is closer to the time to etch the contact openings.

The BPSG patterning of the guard wall opening using the currently preferred embodiment is different from the prior art. The prior art guard wall opening is similar to the pattern 42 shown in FIG. 4. The prior art guard wall opening is substantially coincident with the titanium silicide layer 90 that appears in FIG. 11. The currently preferred embodiment is less likely to have sidewall spacers peel from the edge of the guard ring opening because 1) the guard wall opening is comprised of shorter line segments, and 2) the spacers are not formed over the titanium silicide layer 90, which is subsequently removed.

Figure 14:
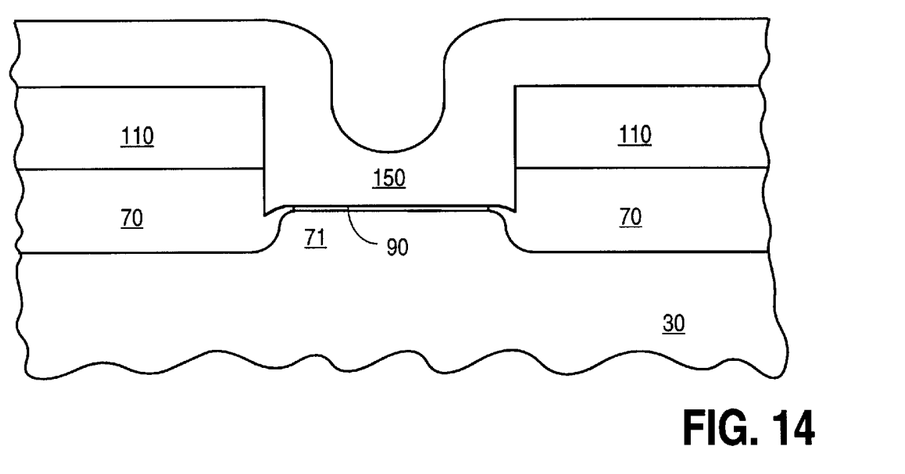
FIG. 14 shows the substrate of FIG. 13 after a tungsten layer is deposited over the substrate.
Figure 15:
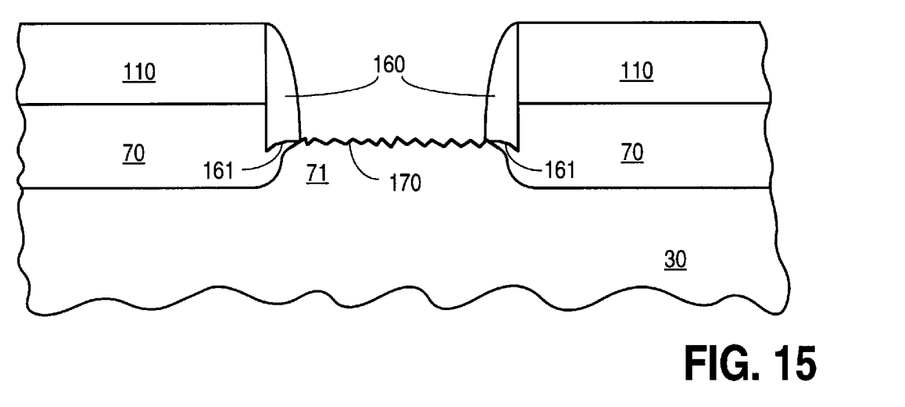
FIG. 15 illustrates the substrate of FIG. 14 after the tungsten layer is anisotropically etched to form sidewall spacers.

In the currently preferred embodiment, the substrate is covered with a tungsten layer 150 about 1 μm thick as shown in FIG. 14. The tungsten deposition is relatively conformal and covers the entire substrate. The tungsten layer 150 fills the contact openings (not shown) and the guard ring opening. The tungsten layer is anisotropically etched to remove the tungsten layer from the top of the BPSG layer 110. Within the guard ring opening, the tungsten within the main line is etched leaving sidewall spacers 160 as shown in FIG. 15. After the tungsten layer is removed from the titanium silicide layer, the titanium silicide layer is isotropically etched thereby forming a roughened silicon surface 170 within the channel region 71. Each spacer 160 has a base 161 that does not lie over the roughened surface 170 or the titanium silicide layer, if not all of the titanium silicide is removed during the etch, because the guard wall opening is at least as wide as the titanium silicide layer 90, as formed, and twice the width of a sidewall spacer's base. The cross members 123 and contact openings (not shown) of the electrically active region are about 1.0 μm wide and are completely filled with the tungsten layer about halfway trough the deposition because the tungsten deposition is generally conformal. Most of the tungsten layer within the cross members 123 and contact openings are not removed by the etch. Other contact filling media may comprise a material including a metal, a metallic compound, or doped polysilicon.

Figure 16:
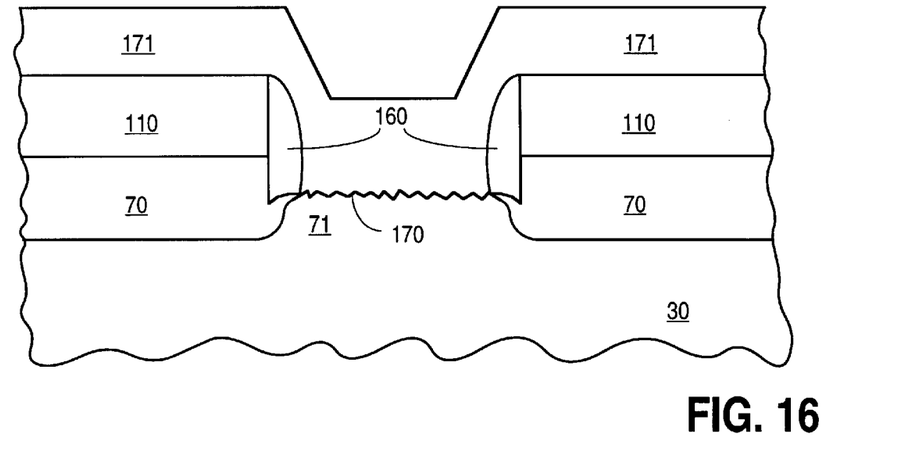
FIG. 16 depicts the substrate of FIG. 15 after an aluminum layer is deposited over the substrate.

Returning to the currently preferred embodiment, the substrate is cleaned in an aqueous solution that typically includes a silicon dioxide etchant, such as HF, for example, before depositing an interconnect layer. The solution etches part of BPSG layer 110, exposed portions of the field oxide areas 70, and substantially all of the remaining titanium silicide layer. The spacers 160 lie over the field oxide areas 70, and the spacers 160 are partially undercut during the clean when some of the field oxide areas 70 are etched. Because the clean is typically short and the field oxide areas etch at a slower rate than the titanium silicide layer, the spacers 160 are undercut less than a prior art method that has sidewall spacers on the titanium silicide layer 90. Therefore, the spacers 160 are less likely to peel away from the substrate because the spacers' bases 161 have substantial mechanical support. After the titanium silicide layer is removed, the channel region 71 is exposed. The channel region 71 has a roughened surface 170 as shown in FIG. 16. The roughened surface 170 generally helps adhesion of a subsequently deposited interconnect layer to the substrate within the guard ring opening. Other surface roughening methods including heavy dose ion implantation may be used, but surface roughening is optional. With an alternate embodiment, a guard ring opening may be formed over a silicon region that is not silicided. In the currently preferred embodiment, the substrate is sputtered with an aluminum layer 171 about 1 μm thick that is used for an interconnect layer as shown in FIG. 16. Other interconnect materials include metals, metallic compounds and doped polysilicon.

Figure 17:
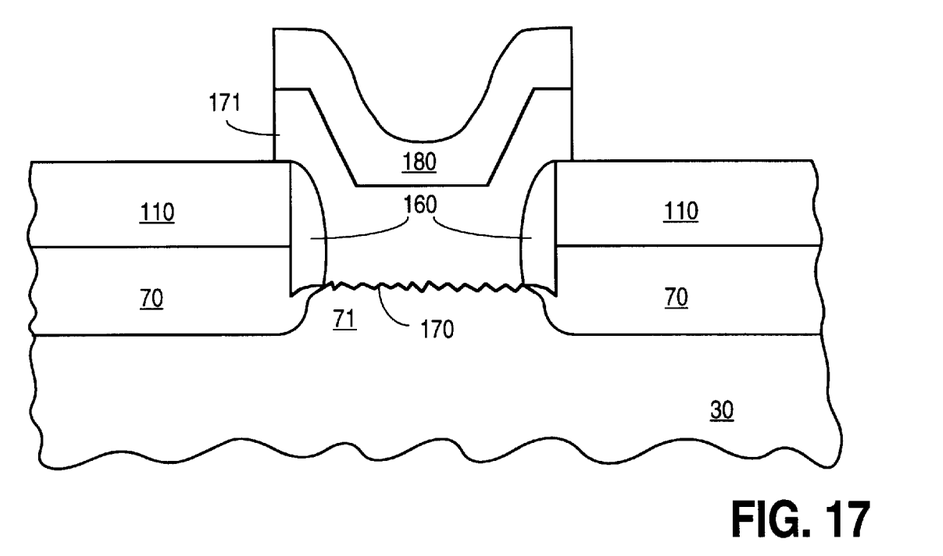
FIG. 17 depicts the substrate of FIG. 16 after the aluminum layer is selectively etched.
Figure 18:
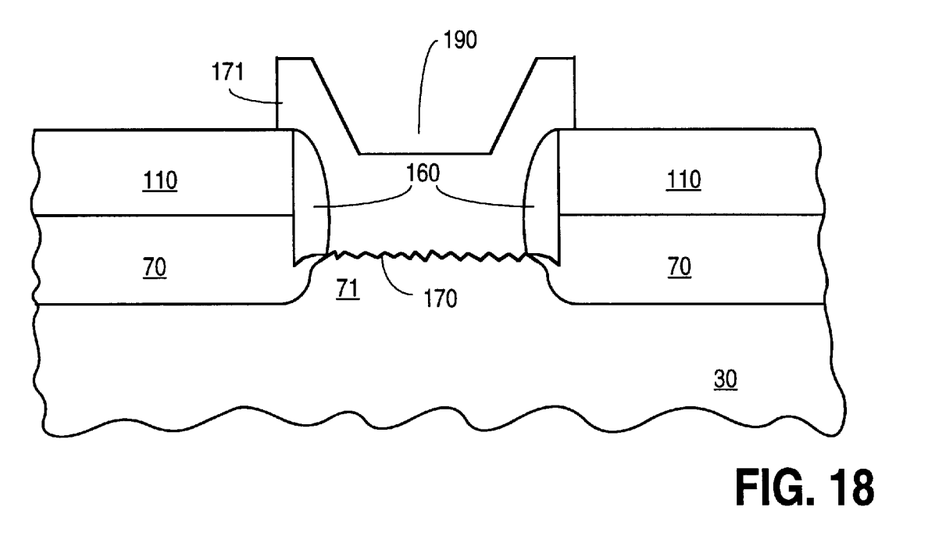
FIG. 18 shows the substrate of FIG. 17 after a patterned photoresist layer is removed.

Returning to the currently preferred embodiment, a third photoresist layer about 1 μm thick is coated over the substrate and patterned to form third photoresist layer members on the aluminum layer 171. FIG. 17 includes a third photoresist layer member 180 over the guard ring opening. Other third photoresist layer members (not shown) lie on the aluminum layer 171 within the electrically active region where contacts have been filled and where bond pads are formed. The aluminum layer is selectively etched and the photoresist members are removed to form the aluminum layer 171 as shown in FIG. 17. Electrical interconnects within the electrically active region and bond pads with their associated interconnects to the electrically active region are formed. Both the electrical interconnects and the bond pads (with their associated interconnects) are not shown in FIG. 17. The photoresist members are removed by plasma ashing or a photoresist solvent, such as m-pyrol, for example. The guard ring 190 including the guard ring opening, sidewall spacers 160, the aluminum layer 171, and the roughened channel surface 170 is illustrated in FIG. 18.

Figure 19:
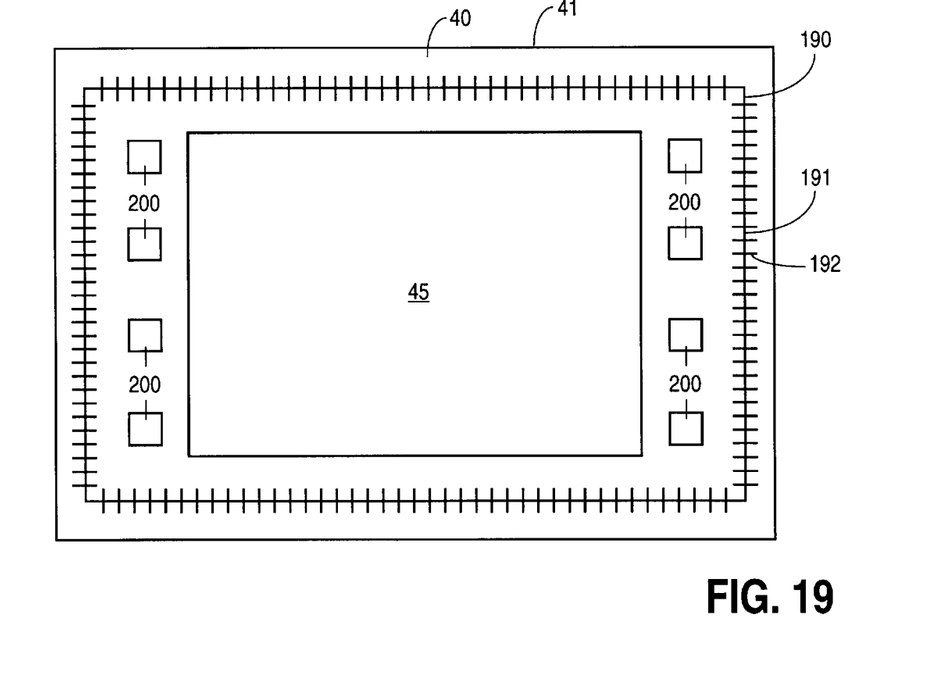
FIG. 19 illustrates a top view a finished die having a guard ring in accordance with the currently preferred embodiment of the present invention.

The substrate is further processed to form a finished die. The die may include additional layers such as interlevel dielectric layers, other interconnect layers, and passivation layers. The formation of these layers are well known in the art. FIG. 19 illustrates a top view of the die formed using the currently preferred embodiment of the present invention. The die 40 has the edges 41 and includes the electrically active region 45, the guard ring 190, and bond pads 200. The guard ring 190 includes the main line 191 and cross members 192. The guard ring 190 lies between the bond pad openings 200 and the edge 41 as illustrated in FIG. 19. The guard ring 72 laterally surrounds the electrically active region of the die and the bond pads. The guard ring pattern generally looks like stitches, and therefore, the pattern of FIG. 19 is called a "stitched" guard ring.

Figure 20:
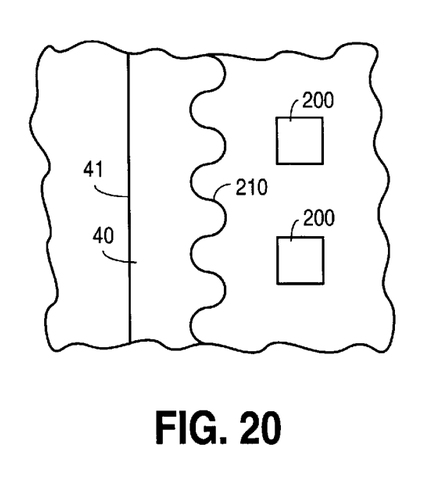
FIGS. 20–25 illustrate alternate embodiments of the present invention.
Figure 21:
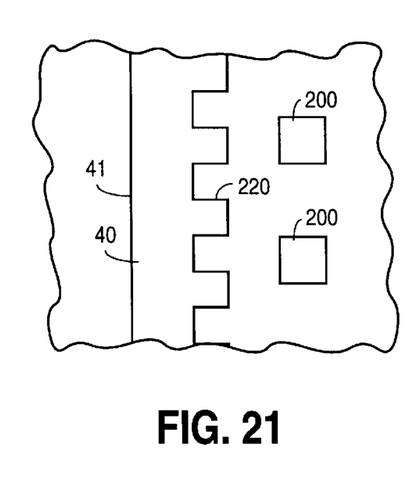
Figure 22:
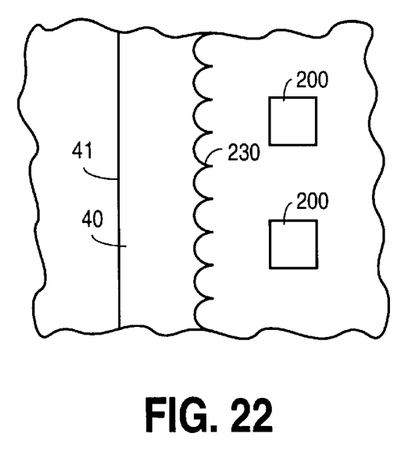
Figure 23:
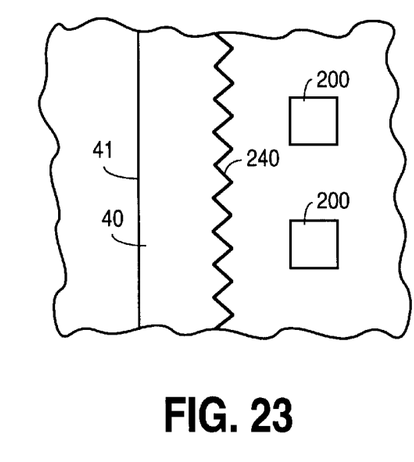
Figure 24:
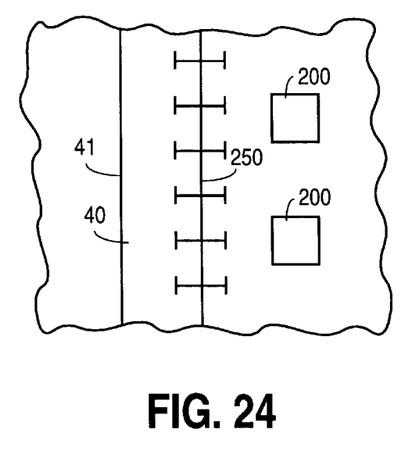
Figure 25:
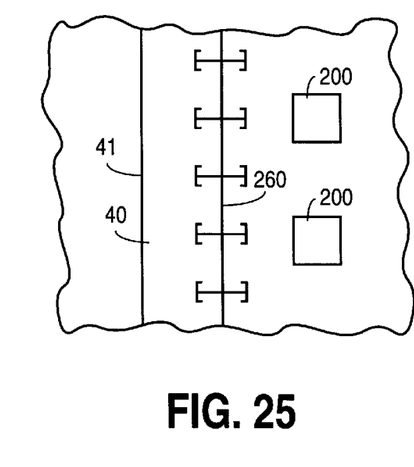

The currently preferred embodiment of the present invention has benefits over the prior art The guard ring includes sidewall spacers less likely to peel from the sides of the guard wall opening, in addition to substantially preventing BPSG layer delamination and contaminants from reaching the electrically active region of the die. The sidewall spacers are comprised of tungsten which typically has a tensile stress. The stress increases as the straight length of the spacer increases. The currently preferred embodiment has a guard ring opening with straight line segments that are no more than 3.0 μm long each. In alternate embodiments, the length of the straight line segments may be varied. The prior art guard ring of FIG. 1 has a guard ring opening with straight line segments that are typically 100 μm or more long. Although no upper or lower limits are known, the straight line segments are typically about 2.0 μm to about 5.0 μm, but should not be longer than about 10.0 μm. The guard ring may have other patterns including a serpentine pattern 210 as illustrated in FIG. 20, a square wave pattern 220 in FIG. 21, a rounded wave pattern 230 in FIG. 22, a saw tooth pattern 240 in FIG. 23, a dog bone pattern 250 in FIG. 24, or a complex dog bone pattern 260 in FIG. 25. It should be noted that the guard ring pattern is not limited to the patterns previously described.

The currently preferred embodiment uses an existing process flow and does not add any steps to the die's process flow. The guard ring opening is formed during a contact opening etch process. The guard ring opening is formed over a channel region between field oxide areas so that the silicon layer within both the guard ring opening and the contact openings is reached in about the same etching time. Therefore, the etch damage within contact openings is reduced.

Another benefit of the currently preferred embodiment is that a guard ring to substantially stop delamination and contamination is formed without other process complications. If the spacers peel from the sides of the guard ring opening, particles, unwanted electrical shorts, and reliability problems are possible. The present invention eliminates these problems caused by the spacers because the spacers are less likely to peel away from the sides of the opening.

Still another benefit of the currently preferred embodiment is that the aluminum layer within the guard ring opening contacts silicon. Aluminum may delaminate from titanium silicide if the titanium silicide layer is not removed prior to depositing the aluminum layer. In an alternate embodiment, the aluminum layer may contact a dielectric layer, such as a field oxide area, for example, at the bottom of the guard ring opening, but aluminum typically adheres better to silicon. In addition, the field oxide area under the aluminum layer may allow some contaminants to pass through the field oxide area.

In an alternate embodiment, the guard ring opening may be formed any time between the BPSG layer deposition and the passivation layer deposition. The guard ring opening may be formed at a time separate from the contact openings. The currently preferred embodiment forms the guard wall opening at the same time as the contact openings, so that extra processing steps are not added. In an alternate embodiment, a separate masking and etch step may be used to form the guard ring opening.

In another alternate embodiment, a guard ring is used to substantially stop delamination within an interlevel dielectric layer, which is between a first interconnect layer and a second interconnect layer. The first interconnect layer is patterned similar to the field isolation pattern of the currently preferred embodiment described above. The first interconnect layer consists of straight line segments similar to item 42 in FIG. 4. The dielectric layer is deposited and patterned to form a guard wall opening that is similar to item 120 in FIG. 11. During patterning, the etch stops on the first interconnect layer. Via openings are typically formed simultaneously with the guard ring opening. A via filling medium is deposited and etched back leaving spacers within the guard ring opening. A second interconnect layer is used to fill the guard ring opening.

The width of the guard ring opening may vary. The width of the guard ring opening must be wide enough so that: 1) sidewall spacers are not formed over a silicide layer, 2) a subsequently deposited guard ring filing material does not have voids within the guard ring opening as it is deposited, and 3) the BPSG layer does not reflow to form a substantially continuous BPSG layer within the bottom of the guard ring opening during a reflow step if the BPSG layer is reflowed after the opening is formed. Typically, the sidewall spacers are the primary concern. Therefore, the guard ring opening typically has a minimum width that is about equivalent to the sum of the width of the silicide layer and twice the width of a spacer's base.

The dielectric layer may delaminated within isolated locations. In an alternate embodiment, a guard wall may be formed. The guard wall is similar to the guard ring except that an electrically active region (or a part thereof) is not laterally surrounded on all sides by the guard wall. A series of disconnected guard walls may lie near the edge of the die. Although the disconnected guard walls provide less protection from delamination and contamination than a guard ring, one may realize benefits of the present invention with this alterative embodiment.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A semiconductor die comprising:

a semiconductor substrate;

an electrically active region on the substrate;

a patterned dielectric layer over the substrate and the electrically active region; and a guard wall extending through the dielectric layer, the guard wall lying adjacent to the electrically active region, the guard wall disposed in a guard wall opening in the dielectric layer, the guard wall opening having a main section and a plurality of cross sections, the guard wall including at least one sidewall spacer along the main section of the guard wall opening and a filling material.

2. The die of claim 1, wherein the guard wall opening has a pattern selected from the group consisting of stitched, serpentine, square wave, rounded wave, saw tooth, dog bone, and complex dog bone.

3. The die of claim 1, wherein the guard wall laterally surrounds the electrically active region.

4. The die of claim 1, wherein the dielectric layer comprises a material selected from the group consisting of silicon dioxide, silicon nitride, and silicon oxynitride.

5. The die of claim 1, wherein the sidewall spacer comprises a material selected from the group consisting of a metal, a metallic compound, and polycrystalline silicon.

6. The die of claim 1, wherein the filling material comprises a material selected from the group consisting of a metal, a metallic compound, polycrystalline silicon, silicon dioxide, silicon nitride, and silicon oxynitride.

7. The die of claim 1 further comprising a field oxide area on the substrate and a channel region adjacent to the field oxide area.

8. The die of claim 7, wherein the guard wall lies over the channel region.

9. The die of claim 8, wherein the channel region has a roughened surface in contact with the filling material.

10. The die of claim 7, wherein the sidewall spacer does not lie over the channel region.

11. The die of claim 1 wherein the cross sections are disposed at a distance along the main section of approximately 10 $\mu$m or less.

12. The die of claim 1 wherein the cross sections have a smaller width than the main section.

13. The die of claim 12 wherein the cross sections have a width of approximately 1 $\mu$m and the main section has a width of approximately 3 $\mu$m.

14. The die of claim 1 wherein the sidewall spacer comprises a material, the material further filling at least a portion of the cross sections.

15. The die of claim 1 wherein the filling material is disposed on a surface comprising silicon.

16. The die of claim 14 wherein the filling material is disposed on a surface comprising silicon.

17. A semiconductor die comprising:

a semiconductor substrate;

an electrically active region on the substrate;

a patterned dielectric layer over the substrate and the electrically active region; and, a guard wall extending through the dielectric layer, the guard wall lying adjacent to the electrically active region, the guard wall disposed in a guard wall opening in the dielectric layer, the guard wall exposing a channel region, the guard wall comprising a filling material disposed on the channel region, and a sidewall spacer along a sidewall of the guard wall opening, the sidewall spacer not being disposed on the channel region.

18. The die of claim 17 wherein the guard wall opening has a main section and a plurality of cross sections.

19. The die of claim 18 wherein the cross sections are disposed at a distance along the main section of approximately 10 $\mu$m or less.

20. The die of claim 18 wherein the cross sections have a smaller width than the main section.

21. The die of claim 18 wherein the sidewall spacer comprises a material, the material further filling at least a portion of the cross sections.

22. The die of claim 17 wherein the sidewall spacer comprises a material selected from the group consisting of a metal, a metallic compound, and polycrystalline silicon, and wherein the filling material comprises a material selected form the group consisting of a metal, a metallic compound, polycrystalline silicon, silicon dioxide, silicon nitride, and silicon oxynitride.

23. The die of claim 17 wherein the filling material is disposed on a surface comprising silicon.

24. The die of claim 17 wherein the filling material is disposed on a surface comprising silicon.

* * * * *